United States Patent [19]

Bell

[11] Patent Number: 4,716,315
[45] Date of Patent: Dec. 29, 1987

[54] TEMPERATURE COMPENSATION APPARATUS FOR AN ELECTRICAL CIRCUIT

[75] Inventor: Isaac M. Bell, Indianapolis, Ind.

[73] Assignee: RCA Corporation, Princeton, N.J.

[21] Appl. No.: 924,316

[22] Filed: Oct. 29, 1986

[51] Int. Cl.[4] .................. G01K 7/24; H03K 17/14
[52] U.S. Cl. ............................ 307/491; 307/310; 307/591; 307/297; 358/166; 330/289
[58] Field of Search ................ 307/491, 310, 591; 330/272, 289, 256, 266; 328/3; 358/37, 166; 361/100

[56] References Cited

U.S. PATENT DOCUMENTS

| | | | |
|---|---|---|---|
| 3,510,579 | 5/1970 | Marsh | 330/289 |
| 3,644,757 | 2/1972 | Rezek et al. | 307/591 |
| 3,651,379 | 3/1972 | Moisand et al. | 330/289 |
| 3,973,147 | 8/1976 | Yu | 307/310 |
| 4,015,149 | 3/1977 | Tsunekawa et al. | 307/310 |
| 4,065,721 | 12/1977 | Rabe | 328/3 |
| 4,101,841 | 7/1978 | Okada et al. | 330/289 |
| 4,228,338 | 10/1980 | Cook et al. | 219/76.13 |
| 4,260,956 | 4/1981 | Hartford | 330/289 |
| 4,367,408 | 1/1983 | Imai et al. | 250/338 |
| 4,401,898 | 8/1983 | Sommerer | 307/491 |
| 4,494,145 | 1/1985 | Kokufukata et al. | 358/166 |

OTHER PUBLICATIONS

Figure 255, pp. 178–180 of Power Transistor Applications Manual, Solid State Division, RCA Corporation.

*Primary Examiner*—Stanley D. Miller
*Assistant Examiner*—Tai V. Duong
*Attorney, Agent, or Firm*—Paul J. Rasmussen; Peter M. Emanuel; Ronald H. Kurdyla

[57] ABSTRACT

Apparatus for compensating a temperature dependent operating characteristic of a semiconductor device includes a compensation circuit which exhibits an electrical time constant closely approximating a thermal time constant of the semiconductor device. A control voltage exhibiting the electrical time constant is applied to the semiconductor device with a sense for substantially negating temperature dependent deviations of the operating characteristic of the semiconductor device.

11 Claims, 1 Drawing Figure

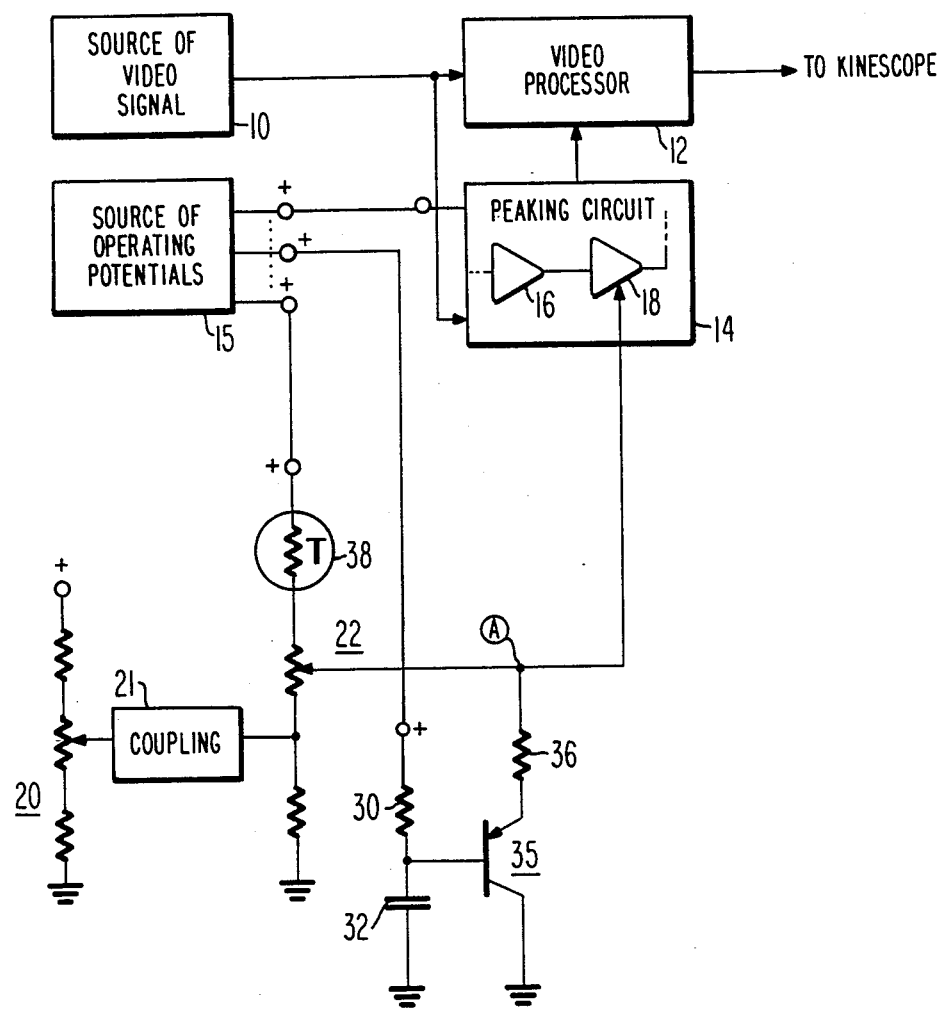

TEMPERATURE COMPENSATION APPARATUS FOR AN ELECTRICAL CIRCUIT

This invention concerns apparatus for temperature compensating an electrical circuit including a semiconductor device.

Electrical circuits including semiconductor devices are often temperature compensated by various means to prevent the operating characteristics of the circuits from varying undesirably with changes in temperature. Several different thermal processes must be taken into account in the design of temperature compensation apparatus. In the case of an integrated circuit semiconductor device for example, one thermal process involves the self-heating of the integrated circuit, wherein a thermal wave propagates from the substrate and semiconductor elements of the integrated circuit to the surface of the integrated circuit. This process begins when the device is energized and exhibits a relatively short thermal time constant of several minutes, at which point the temperature of the device due to self-heating is substantially stable. Another thermal process involves an ambient temperature change in the immediate vicinity of the integrated circuit, such as an increase in temperature inside the cabinet of a television receiver containing the integrated circuit, beginning soon after the receiver is energized. In this case a thermal wave propagates from the surface of the integrated circuit inward, and typically exhibits a much longer time constant (e.g., ten times longer) than the time constant of the self-heating process. A change in the ambient temperature of the room in which the receiver is located further complicates the temperature compensation procedure.

Known techniques for temperature compensating semiconductor devices such as transistors and integrated circuits include the use of elements such as thermistors, diodes, transistors and resistors which sense the temperature change to which the device being compensated is subjected and exhibit operating characteristics which vary with temperature so as to compensate for an otherwise unwanted change in the operation of the device being compensated. The compensating elements are thermally coupled to the device being compensated, such as by being located within the same integrated circuit device or by being attached to the heatsink of the device being compensated. It is herein recognized, however, that such manner of thermal coupling may be unavailable for one reason or another, so that alternative means must be used to achieve appropriate temperature compensation in some systems.

For example, U.S. Pat. No. 4,388,648—Harwood et al. describes a system for automatically controlling the high frequency peaking content of a video signal to thereby control the "sharpness" of a displayed picture. The system disclosed in this patent is intended for the most part to be constructed as an integrated circuit, and employs closed loop feedback control to automatically maintain a desired amount of video signal peaking. The system includes plural gain controlled amplifiers, a manually adjustable peaking control potentiometer and an LC bandpass filter coupled to a first external terminal of the integrated circuit, and an RC peak detector filter coupled to a second external terminal. The feedback control loop is capable of correcting errors, such as gain mistracking errors of the amplifiers, caused by temperature changes. It may be desirable to operate such video peaking system in an open-loop configuration rather than in a closed-loop configuration under certain conditions. This can be readily achieved by removing the LC filter and the RC peak detector filter, and by coupling the wiper of the peaking control potentiometer to the second terminal in place of the RC filter. However, an open-loop configuration increases the likelihood that the system will exhibit unwanted changes in operating characteristics due to temperature changes. Specifically, it has been observed that, for a given value of peaking control voltage from the control potentiometer, the amount of video signal peaking may vary by ±40% until the temperature affecting the system has stabilized, e.g., after about one hour in a television receiver environment.

To redesign such integrated circuit system to eliminate the possibility of temperature dependent errors in the open-loop configuration, or to develop another integrated circuit system intended only for open-loop operation, would be costly and may involve compromises in other areas. Thus it is desirable to be able to use a system such as that disclosed in the Harwood patent in an open loop configuration without experiencing operating errors due to long and short term temperature effects. This result is achieved by employing apparatus in accordance with the principles of the present invention.

In accordance with the present invention, there is disclosed herein apparatus having an electrical time constant which closely approximates a thermal time constant of a semiconductor device to be temperature compensated. In a disclosed preferred embodiment of the invention in a video signal processing section of a television receiver, a resistor-capacitor (RC) electrical time constant network is coupled to a source of voltage which is developed when the receiver is energized. The capacitor is charged via the resistor and exhibits an exponential voltage change with time constant which closely approximates a relatively short, e.g., self-heating, thermal time constant of the signal processing circuit. The capacitor voltage is applied to the signal processing circuit so as to compensate for the effects of temperature upon the operation of the circuit.

In accordance with a feature of the invention, the electrical time constant network acts in conjunction with a thermistor which compensates for long term ambient temperature changes.

The sole figure of the drawing shows a portion of a television receiver including temperature compensation apparatus in accordance with the principles of the present invention.

A video signal from a source 10 is applied to a video signal processor 12 which provides an output video signal to an image reproducing kinescope (not shown). The high frequency content of the video signal from processor 12 is controlled in response to an output signal, e.g., including a peaking signal having pre-shoot and over-shoot components as known, from a peaking control circuit 14 which responds to the video signal from source 10 as discussed in aforementioned U.S. Pat. No. 4,388,648. Peaking circuit 14 is energized by means of an operating potential (+) from a source 15. Peaking control circuit 14 includes amplifiers 16 and 18, among other circuit elements. The gain of amplifier 18, and thereby the magnitude of the peaking components in the output signal of circuit 14, is controlled in response to the setting of a peaking control potentiometer 20, for example. A peaking control voltage from the wiper of potentiometer 20 is conveyed to a gain control input of amplifier 18 via a coupling network 21, e.g., including an emitter follower buffer stage, a factory pre-set potentiometer 22, and a node A. Potentiometer 22 determines the maximum amount of peaking produced and compensates for tolerances of coupling and peaking circuit elements. In this example the signal gain of peaking control circuit 14 varies undesirably with temperature, causing a significant unwanted change in the amount of peaking present in a displayed picture, until the temperature of circuit 14 stabilizes.

The temperature dependent variation of the gain of circuit 14 is compensated for by means of a compensation circuit including a resistor 30 coupled to an operating potential (+) derived from source 15, a capacitor 32 which forms an RC time constant network with resistor 30, and a transistor 35 which conveys the voltage developed across capacitor 32 to a gain control input path of amplifier 18 via a resistor 36 and node A. The RC network comprising elements 30 and 32 compensates for relatively short term temperature changes associated with self-heating of the semiconductor devices constituting circuit 14. Relatively long term ambient temperature changes are compensated for by means of a thermistor 38, which is coupled to the gain control input path of amplifier 18 via potentiometer 22.

The self-heating process of an integrated circuit, which in this case includes peaking circuit 14, can be defined by the exponential expression $$\Delta T = PR1(1 - e^{-t/R1C1}) \quad (1)$$

where
$\Delta T$ is the temperature change of semiconductor junctions in the integrated circuit due to self heating,
P is the heating power (watts),
R1 is the semiconductor junction-to-case thermal resistance (° C/watt),
C1 is heat capacity (watt-sec/° C), and
t is time.

The exponential change in voltage across capacitor 32 with time, $\Delta V$, is given by the expression $$\Delta V = V_0(1 - e^{-t/R2C2}) \quad (2)$$

where
$V_0$ is the steady state voltage developed across capacitor 32,
R2 is the value of resistor 30,
C2 is the value of capacitor 32, and
t is time.

The exponential functions determined by expressions (1) and (2) will match each other if time constant R2C2 is equal to thermal time constant R1C1. In accordance with the principles of the present invention, the values of resistor R2 (resistor 30) and capacitor C2 (capacitor 32) are chosen so that voltage $\Delta V$ as developed across capacitor 32 and applied to the gain control input of amplifier 18, causes the gain of amplifier 18 to change at the same rate as a gain change caused by temperature, but in a direction opposite to the direction of gain change caused by temperature. Voltage $\Delta V$ serves to substantially negate the temperature induced gain change of the peaking control circuit due to self-heating during the first several minutes of operation, e.g., about five minutes, by modifying the peaking control voltage coupled to the gain control input of amplifier 18.

More specifically, when the receiver is initially energized and operating voltages (+) appear, capacitor 32 begins charging via resistor 30 with an electrical time constant substantially equal to the self-heating thermal time constant of the peaking circuit. Transistor 35 is rendered conductive at this time. The base voltage of transistor 35 gradually increases as the voltage across capacitor 32 increases, thereby gradually decreasing the emitter current conduction of transistor 35. The gradual reduction of emitter current produces a related gradual increase in the peaking control voltage developed at node A in the gain control input path of amplifier 18. The voltage across capacitor 32 reverse biases transistor 35, rendering it nonconductive, after a predetermined period of time corresponding approximately to the time required for the temperature increase of the peaking circuit due to self heating to stabilize, e.g., after several minutes. After this time the circuit including elements 30, 32, 35 and 36 no longer influences the peaking control voltage. Thus transistor 35 serves to initially "pull down" the gain control input of amplifier 18 to a voltage related to the initial voltage on capacitor 32, until a time several minutes later when transistor 35 decouples the gain control input of amplifier 18 from capacitor 32 when the increased voltage on capacitor 32 reverse biases transistor 35.

Thermistor 38 exhibits a negative temperature coefficient. An unwanted increase in the gain of the peaking circuit, otherwise produced by an ambient temperature increase, is offset by a decrease in the resistance of thermistor 38 which produces a compensating decrease in gain. The change in the resistance of thermistor 38 modifies a given peaking control voltage at the wiper of potentiometer 22 so as to produce a net effect of substantially no change in gain as ambient temperature changes. Thermistor 38 operates independent of the circuit including elements 30, 32, 35 and 36. The circuit including thermistor 38 should be designed so that the current flowing through thermistor 38 is insufficient to generate a self-heating effect.

Transistor 35 conducts a small current insufficient to produce a significant self-heating effect. Also, with a small current drawn by the base of transistor 35, resistor 30 can be chosen large enough to require a small value, relatively inexpensive capacitor 32 to achieve a given time constant on the order of several minutes. An ambient temperature change within the receiver cabinet has substantially no effect on transistor 35 since transistor 35 is rendered nonconductive after a few minutes.

Transistor 35 and resistor 36 act as a variable resistance relative to the gain control input path of amplifier 18. The value of resistor 36 is chosen to limit the amount of current shunted from the gain control input path in accordance with the input sensitivity requirements of peaking circuit 14. For example, when the gain control input of amplifier 18 is very sensitive, the peaking control voltage may vary from 0.6 volt to 0.7 volt. In order to permit the gain control voltage applied to amplifier 18 to vary over this small 0.1 volt range, the variable resistance formed by transistor 35 and resistor 36 should be significantly larger, e.g., ten times larger, than the value of the resistance between the wiper of potentiometer 22 and ground. The value of resistor 36 also should be large enough so that the current conducted by transistor 35 does not induce self-heating in transistor 35.

The rate of voltage change across capacitor 32 and at node A, i.e., the slope of the voltage-versus-time charging characteristic of capacitor 32, is a function of the electrical time constant R2C2 as previously defined. The value of resistor 36 assists to determine the initial voltage which is developed at node A from the voltage across capacitor 32.

When tested in connection with an integrated circuit including a peaking system of the type described in the aforementioned Harwood et al. patent in an open loop configuration, the disclosed temperature compensation circuit was observed to produce good peaking stability of about ±5% compared to ±40% without temperature compensation, over a temperature range of from 20° C. to 60° C. measured at the case of the integrated circuit device.

What is claimed is:

1. Apparatus for compensating a temperature dependent characteristic of a semiconductor device having a thermal time constant, said apparatus including:
   a source of operating potential coupled to said semiconductor device;
   a compensation circuit coupled to said source of operating potential and exhibiting an electrical time constant approximating said thermal time constant of said semiconductor device;
   means for deriving from said compensation circuit a control signal exhibiting said electrical time constant; and
   means for coupling said control signal to said semiconductor device to alter said characteristic of said semiconductor device in a direction opposite to a direction produced by temperature variations.

2. Apparatus according to claim 1 in a signal processing system, wherein
   said source of operating potential develops operating potentials for said semiconductor device and for said compensation circuit when said system is energized; and
   a decoupling circuit decouples said control signal from said semiconductor device within a predetermined time, determined by said electrical time constant, after said system is energized.

3. Apparatus according to claim 1, wherein said compensation circuit includes:
   a resistance coupled to an operating potential; and
   a capacitance for receiving current conducted by said resistance.

4. Apparatus according to claim 3, wherein:
   said deriving means derives said control signal from a voltage developed across said capacitance; and
   said deriving means includes a threshold conduction device for conveying said control signal to said semiconductor device.

5. Apparatus according to claim 4, wherein:
   said control signal is coupled to said semiconductor device via a resistor.

6. Apparatus according to claim 4, wherein said deriving means includes:
   a transistor with an input first electrode coupled to said capacitance, and second and third electrodes defining a main current conduction path of said transistor, said main current conduction path being coupled to said semiconductor device.

7. Apparatus according to claim 6, wherein:
   said main current conduction path includes a resistor.

8. Apparatus according to claim 1, wherein:
   said semiconductor device is an integrated circuit; and
   said compensation circuit and said deriving means are located external to said integrated circuit.

9. Apparatus according to claim 1, wherein:
   said control signal is coupled to an input of said semiconductor device; and
   a thermistor responsive to ambient temperature changes is coupled to said input of said semiconductor device.

10. Apparatus according to claim 4 in a signal processing system, wherein:
    said source of operating potential develops operating potentials for said semiconductor device and for said compensation circuit when said system is energized; and
    said threshold conduction device decouples said control signal from said semiconductor device within a predetermined time, determined by said electrical time constant, after said system is energized.

11. Apparatus according to claim 1, wherein:
    said semiconductor device is a signal processing device having a temperature dependent signal gain characteristic and a gain control input for receiving a gain control voltage via a control path;
    said control signal is coupled to said control path for altering said gain control voltage received by said gain control input for the duration of a given interval, determined by said electrical time constant, after said semiconductor device is initially energized, to compensate for the effects of initial self-heating of said semiconductor device; and
    means responsive to ambient temperature changes is coupled to said gain control input.

* * * * *